United States Patent
Hsieh et al.

(10) Patent No.: US 6,707,677 B1
(45) Date of Patent: Mar. 16, 2004

(54) CHIP-PACKAGING SUBSTRATE AND TEST METHOD THEREFOR

(75) Inventors: Han-Kun Hsieh, Miaoli (TW); Wei-Feng Lin, Hsinchu (TW); Yi-Chang Hsieh, Hsinchu (TW)

(73) Assignee: Silicon Integrated Systems Corp., Hsin chu (TW)

( * ) Notice: Subject to any disclaimer, the term of this patent is extended or adjusted under 35 U.S.C. 154(b) by 0 days.

(21) Appl. No.: 10/385,681

(22) Filed: Mar. 12, 2003

(51) Int. Cl.[7] ............................ H05K 1/00; H05K 1/18; H05K 7/02; H05K 7/06; H05K 7/08
(52) U.S. Cl. ................... 361/748; 361/760; 361/761; 361/762; 361/764; 361/783; 361/750; 361/751; 174/255; 174/260; 174/261
(58) Field of Search ................... 361/748, 750, 361/751, 760, 761, 762, 764, 783, 767; 174/255, 260, 261

(56) References Cited

U.S. PATENT DOCUMENTS 5,307,012 A * 4/1994 Bhattacharyya et al. ..... 324/762
5,378,981 A * 1/1995 Higgins, III ................. 324/765
6,351,392 B1 * 2/2002 Palaniappa .................. 361/785
6,427,222 B1 * 7/2002 Shau ............................ 716/4
6,566,899 B2 * 5/2003 Tamaru et al. .............. 324/754

* cited by examiner

Primary Examiner—Randy Gibson
Assistant Examiner—Thanh Yen Tran
(74) Attorney, Agent, or Firm—Birch, Stewart, Kolasch & Birch, LLP

(57) ABSTRACT

A chip-packaging substrate and test method therefor. The chip-packaging substrate includes at least one package area and a connection area enclosed by and connected to the package areas. A test circuit is arranged within the connection area, passing through at least two wire layers and the insulation layer therebetween. The test circuit electrically connects the first electrodes. Failure of the chip-packaging substrate is detected when the test circuit is open between any two electrodes.

18 Claims, 4 Drawing Sheets

CHIP-PACKAGING SUBSTRATE AND TEST METHOD THEREFOR

BACKGROUND OF THE INVENTION

1. Field of the Invention

The present invention relates to a chip-packaging substrate, and in particular to a chip-packaging substrate having a test circuit for failure controls.

2. Description of the Related Art

As electronic devices become thinner and smaller, printed circuit boards (PCB) are required to be thinner, with narrower wires and intervals. At the present, one of the most popular chip packages is the plastic ball grid array (PBGA) package. PBGA packages address the need for increased pin counts, such that package size is nearly identical to those packaged by previous methods.

FIG. 1A is schematic top view of a conventional PBGA substrate. FIG. 1B shows a chip-packaging unit from FIG. 1A. The PBGA substrate shown in FIG. 1A is the substrate used in package factories, provided by PCB suppliers. The PBGA substrate includes, but is not limited to, four chip-packaging units 10 for four IC chips. The chip-packaging unit 10 includes a square package area 12 with an enclosed connection area 11. The package area 12 has a plurality of pads 121 arranged in array. The connection area 11 connects the package areas 12 for packaging facilities to secure the PBGA substrate when packaging chips, after which the connection area 11 is discarded, becoming waste material.

However, PBGA substrates are multilayer structures (more than 8 layers) with thickness about 0.5 mm and wire width and intervals less than 0.1 mm. PBGA substrates must withstand high temperatures, high humidity, and strong acidity and alkalinity during PCB fabrication. PBGA substrates are easily deformed and delaminated by high temperatures, causing defects when stacking wire and insulation layers.

Previously, PBGA substrates could only be tested after chips were completely packaged on the package areas. The result of the test only shows whether the packaged chips work or not, without individually identifying whether defects are caused by chips, PBGA substrates or the packaging process. Therefore, the yield ratio of the PBGA packaged chips is higher than the sum of the yield ratio of each individual part. The cost of PBGA packages is thus higher than other conventional package methods.

Referring to FIG. 1A, the package areas 12 and the connection area 11 of the PBGA substrate are formed by the same fabrication method at the same time. The connection area 11 also has the same wire layers and insulation layers in the package areas 12. The difference between the package areas 12 and the connection area 11 is that the connection area 11 does not have a predetermined circuit and will be discarded as waste material after chips are packaged on the package areas.

SUMMARY OF THE INVENTION

Accordingly, an object of the invention is to provide chip-packaging substrates having a test circuit on the connection area, which will be discarded after the chip package process, to pre-test the PBGA substrates, and filter out damaged substrates, thereby reducing the cost of the PBAG packaged chips.

The present invention provides a chip-packaging substrate having a package area, connection area and test circuit. The connection area is connected to and enclosed by the package areas. A test circuit is arranged within the connection area, passing through at least two wire layers and the insulation layer therebetween. The test circuit electrically connects the first electrodes. Failure of the chip-packaging substrate is detected when the test circuit is open between any two electrodes.

According to another embodiment of the invention, the chip-packaging substrate comprises a plurality of package areas connected by a connection area. As well, the connection area has a plurality of electrodes and a test circuit passing through at least two wire layers and the insulation layer therebetween and electrically connecting the electrodes.

The present invention also provides a method for testing chip-packaging substrates. The method first comprises providing a chip-packaging substrate with a connection area enclosing a plurality of package areas. The connection area has a plurality of electrodes connected by a test circuit. Next, the conductivity between two selected electrodes is checked. Finally, failure of the chip-packaging substrate is detected when the test circuit is open between the two selected electrodes.

According to the embodiments of the invention, the second insulation surface has a plurality of second electrodes. The test circuit electrically connects the second electrodes. The package area has a plurality of insulation layers and wire layers extending from the connection area. The insulation layers comprise macromolecular compounds.

Furthermore, the connection area has a plurality of through holes, such that the test circuit electrically connects the wire layers thereby. The connection area also has a plurality of blind via holes, such that the test circuit can electrically connect any two wire layers thereby. The package area has a predetermined circuit, and the predetermined circuit and the test circuit are formed at the same time.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
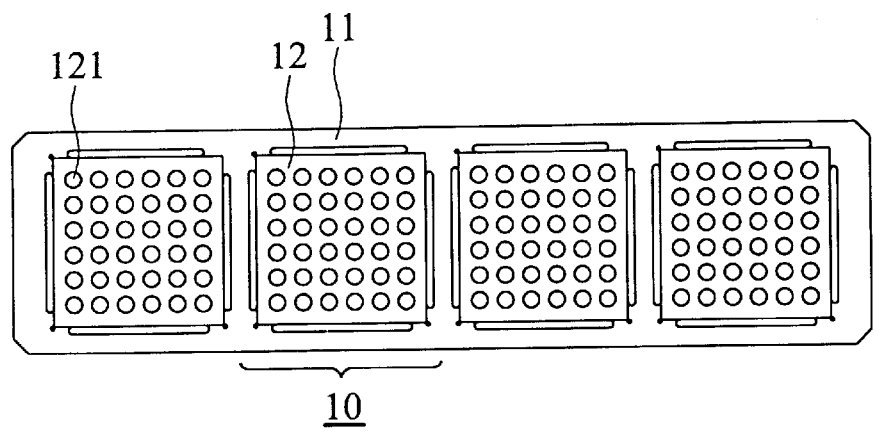
FIG. 1A is schematic top view of a conventional PBGA substrate as referenced in the Prior Art.
Figure 1B:
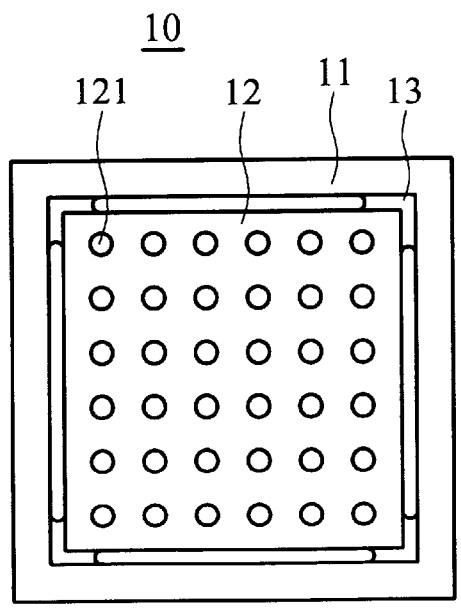
FIG. 1B shows a chip-packaging unit from FIG. 1A.
Figure 2A:
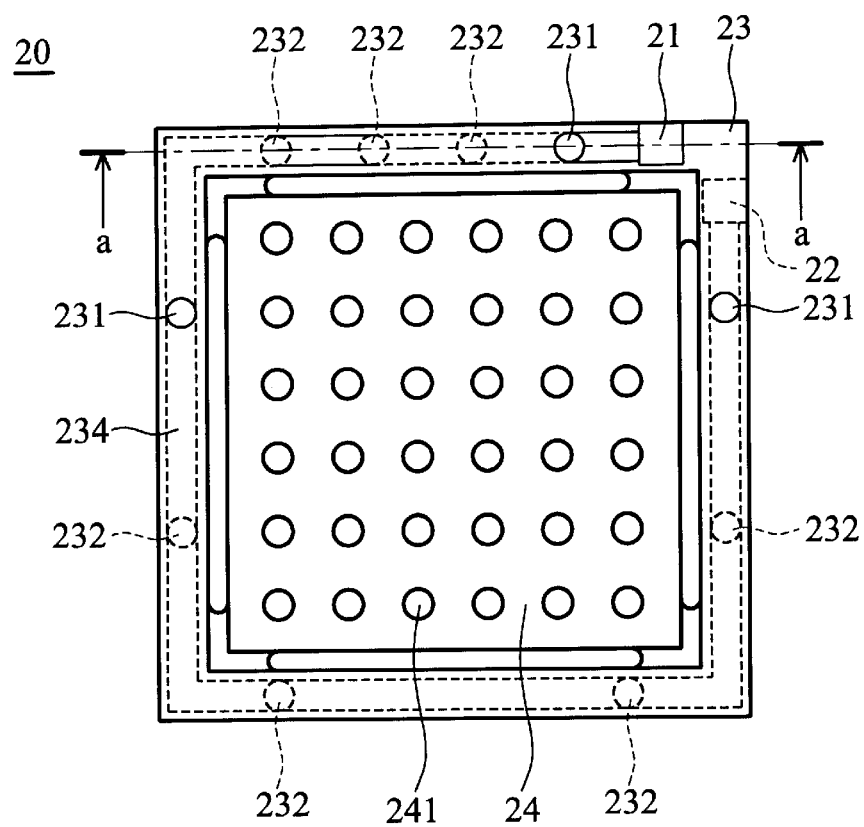
FIG. 2A is a top view of the PBGA substrate in the first embodiment of the invention.

FIG. 2A is a top view of the PBGA substrate in the first embodiment of the invention. The PBGA substrate 20 shown in FIG. 1A is composed of a plurality of wire layers and insulation layers and divided into a square package area 24 and an enclosed connection area 23. The package area 24 has a predetermined circuit and a plurality of pads 241 arranged in array.

Referring to FIG. 2A, the connection area 23 of the PBGA substrate 20 connects to the package areas 24 at four corners. The connection area 23 of the invention has a first electrode 21 and a second electrode 22 on the insulation surface. An additional test circuit 23 is disposed within the connection area 23, surrounding the package area 24 and electrically connecting the first electrode 21 and the second electrode 22. On the path of the test circuit 23, there are though holes 231 and blind via holes 232 formed by the same PCB process as the circuit in the package area 24. The test circuit 23 electrically connects each of the wire layers by the though holes 231 or the blind via holes 232 to check the PBGA substrate 20 for defects.

Figure 2B:
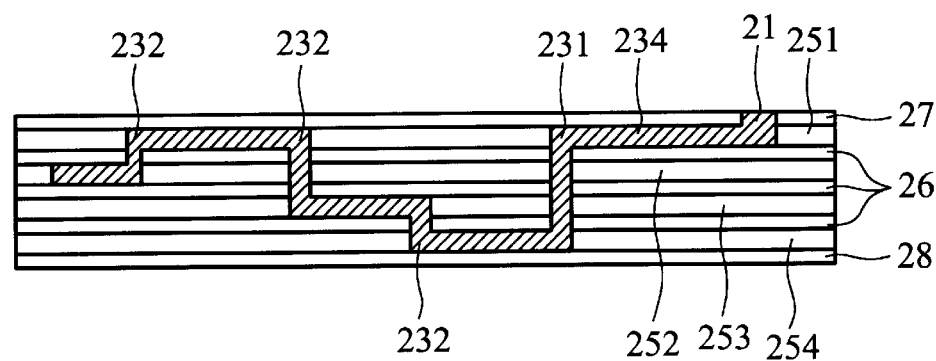
FIG. 2B is a cross section of the line a—a shown in FIG. 2A.

FIG. 2B is a cross section of the line a—a shown in FIG. 2A. In order to simplify the drawing, the PBGA s substrate 20 includes, but is not limited to, four wire layers 251~254. An insulation layer 26 is disposed between each two wire layers. The insulation layers 26 and the wire layers 251~254 are alternatively disposed between a first insulation surface 27 and a second insulation surface 28. The wire layers are named from top to bottom as first wire layer to fourth wire layer 251~254.

In FIGS. 2A and 2B, the through holes 231 pass through the wire layers 251~254 and the insulation layers 26 of the PBGA substrate 20, filled with metal or conductive materials to electrically connect the first wire layer 251 and the fourth wire layer 254. The blind via holes 232 form the interconnections between any two wire layers. The test circuit 23 connected to the first electrode 231 extends to the fourth wire layer 254 by the through hole 231, and then to the third wire layer 253, the first layer 251 and the second wire layer 252 thereby 232. After the test circuit 23 encircles the package area 24, it electrically connects the first electrode 21 on the top surface and the second electrode 22 on the bottom surface. Furthermore, the PBGA substrate 20 can have a plurality of test electrodes on each surface, such as the first electrode 21 and the second electrode 23 to divide the test circuit 23 into several sections. This arrangement determines whether each section of the test circuit 23 is open or has high resistance, and, thereby, whether the PBGA substrate 20 is deformed or delaminated.

Figure 3:
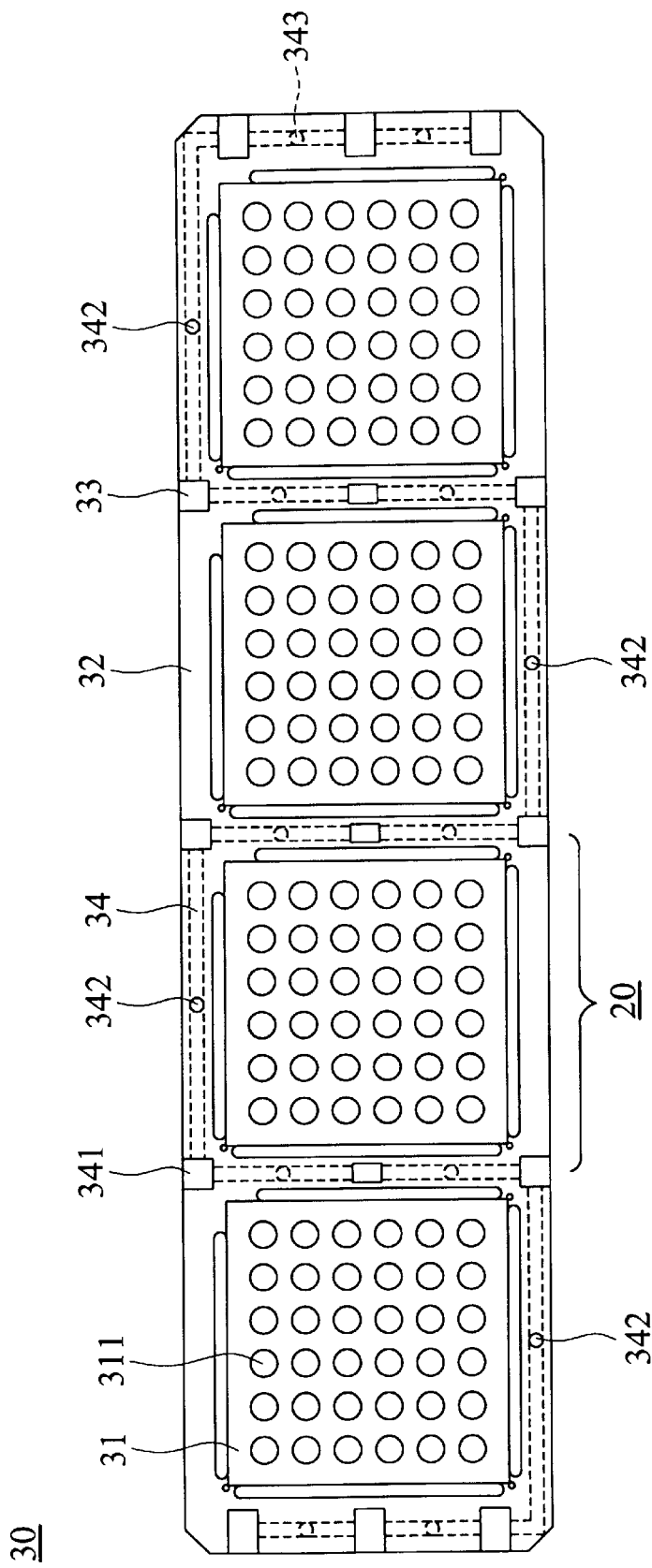
FIG. 3 is a top view of the PBGA substrate in the second embodiment of the invention.

FIG. 3 is a top view of the PBGA substrate in the second embodiment of the invention. In FIG. 3, the PBGA substrate 30 is composed of a plurality of wire layers and insulation layers and divided into four square package areas 31, or chip-packaging units, and an enclosed connection area 32. The package area 31 has a plurality of pads 311 arranged in array. The connection area 32 connects the package areas 31 to secure the PBGA substrate 30 when packaging chips. The connection area 32 of the PBGA substrate 30 connects to the package areas 31 at four corners. The connection area 32 of this embodiment has a plurality of electrodes 33 on the top insulation surface. An additional test circuit 34 is disposed within the connection area 32, surrounding the package areas 31 and electrically connecting these electrodes 33. On the path of the test circuit 34, there are though holes 342 and blind via holes 343 formed by the conventional PCB process as the predetermined circuit in the package area 31. As well, the electrodes 33 of this embodiment can be disposed on the bottom surface of the PBGA substrate 30 as described in FIG. 2A, and electrically connected by the test circuit 34 for failure testing.

Accordingly, the connection area 32 of the PBGA substrate 30 provided by the present invention is fully utilized. The test circuit 34 disposed in the connection area 32 simply encloses the package areas 31. Thus, the PBGA substrate 30 can be checked after it is produced. When the test circuit 34 between any two electrodes is open, it indicates that PBGA substrate 30 has defects near the open electrodes. PBGA substrates 30 with defects can be eliminated before packaging chips. Thus, the yield ratio of the PBGA packaged chips is greatly improved and the cost reduced.

The wire layers of the PBGA substrate comprise copper, gold or other conductive materials. The insulation layers comprise polymer resin, such as epoxy, polyester, cyanate ester or polyethylene.

Figure 4:
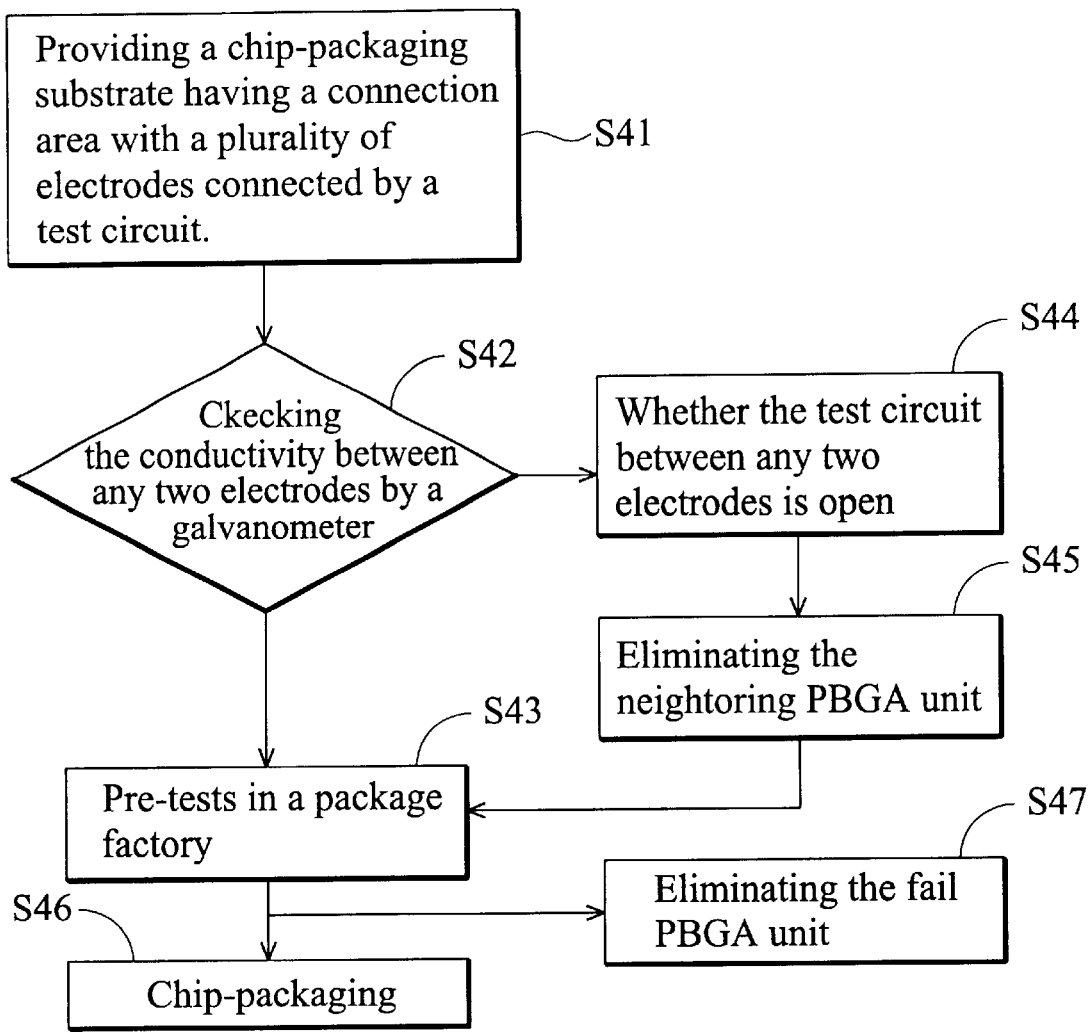
FIG. 4 is a flowchart showing the test method of the invention.

FIG. 4 is a flowchart showing the test method of the invention. The present invention also provides a method for testing chip-packaging substrates. The method first comprises providing a chip-packaging substrate with a connection area enclosing a plurality of package areas. The connection area has a plurality of electrodes connected by a test circuit (S41). Next, the conductivity between two selected electrodes is checked by a galvanometer or a jig(S42). When the test circuit between any two electrodes is open, the neighboring PBGA unit is identified as having defects and is eliminated (S44~S45). When all the electrodes are electrically connected, the PBGA substrate is then delivered to a package factory, undergoing the packaging pre-tests of the package factory. After that, the substrate is double-checked and used for packaging chips (S46). Thus, the yield ratio of the PBGA packaged chips is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip-packaging substrate, comprising:
   a package area;
   a connection area, connected to the package area and having a plurality of insulation layers and wire layers alternatively disposed between a first insulation surface and a second insulation surface thereof, wherein the first insulation surface has a plurality of first electrodes; and
   a test circuit, arranged within the connection area, passing through at least two wire layers and the insulation layers therebetween, and electrically connecting the first electrodes.

2. The chip-packaging substrate as claimed in claim 1, wherein the second insulation surface has a plurality of second electrodes, and the test circuit electrically connects the second electrodes.

3. The chip-packaging substrate as claimed in claim 1, wherein the connection area encloses the package area.

4. The chip-packaging substrate as claimed in claim 1, wherein the package area has a plurality of insulation layers and wire layers extending from the connection area.

5. The chip-packaging substrate as claimed in claim 1, wherein the connection area has a plurality of through holes, such that the test circuit electrically connects the wire layers by the through holes.

6. The chip-packaging substrate as claimed in claim 1, wherein the connection area has a plurality of blind via holes, such that the test circuit electrically connects at lest two wire layers thereby.

7. The chip-packaging substrate as claimed in claim 1, wherein the package area has a predetermined circuit, and the predetermined circuit and the test circuit are made at the same time.

8. A chip-packaging substrate, comprising:

a plurality of package areas;

a connection area, connected to the package area and having a plurality of insulation layers and wire layers alternatively disposed between a first insulation surface and a second insulation surface thereof, wherein the first insulation surface has a plurality of first electrodes; and a test circuit, arranged within the connection area, passing through at least two wire layers and the insulation layers therebetween and electrically connecting the first electrodes.

9. The chip-packaging substrate as claimed in claim 8, wherein the second insulation surface has a plurality of second electrodes, and the test circuit electrically connects the second electrodes.

10. The chip-packaging substrate as claimed in claim 8, wherein the connection area encloses the package area.

11. The chip-packaging substrate as claimed in claim 8, wherein the package area has a plurality of insulation layers and wire layers extending from the connection area.

12. The chip-packaging substrate as claimed in claim 8, wherein the connection area has a plurality of through holes, such that the test circuit electrically connects the wire layers by the through holes.

13. The chip-packaging substrate as claimed in claim 8, wherein the connection area has a plurality of blind via holes, such that the test circuit electrically connects at least two wire layers thereby.

14. The chip-packaging substrate as claimed in claim 8, wherein the insulation layers comprise macromolecular compounds.

15. The chip-packaging substrate as claimed in claim 8, wherein the package area has a predetermined circuit, and the predetermined circuit and the test circuit are made at the same time.

16. A method for testing chip-packaging substrates, comprising the step of:

providing a chip-packaging substrate with a connection area connected a plurality of package areas, wherein the connection area has a plurality of insulation layers and wire layers alternatively disposed between a first insulation surface and a second insulation surface thereof, and has a plurality of electrodes on the first insulation surface is connected by a test circuit within the connection area, passing through at least two wire layers and the insulation layers therebetween; and selectively checking the conductivity between two electrodes, wherein failure of the chip-packaging substrate is detected when the test circuit is open between the two electrodes.

17. The method as claimed in claim 16, wherein the second insulation surface has a plurality of second electrodes, and the test circuit electrically connects the second electrodes.

18. The method as claimed in claim 16, wherein the package area has a predetermine circuit, and the predetermined circuit and the test are made at the same time.

* * * * *